(12) United States Patent
Xiang et al.

(10) Patent No.: US 12,014,777 B2
(45) Date of Patent: Jun. 18, 2024

(54) NON-VOLATILE MEMORY AND OPERATING METHOD THEREOF

(71) Applicant: YANGTZE MEMORY TECHNOLOGIES CO., LTD., Wuhan (CN)

(72) Inventors: Li Xiang, Wuhan (CN); Weihua Shi, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 111 days.

(21) Appl. No.: 17/568,622

(22) Filed: Jan. 4, 2022

(65) Prior Publication Data

US 2022/0180929 A1   Jun. 9, 2022

Related U.S. Application Data

(63) Continuation of application No. PCT/CN2021/121714, filed on Sep. 29, 2021.

(30) Foreign Application Priority Data

Dec. 7, 2020   (CN) .......................... 202011419073.6

(51) Int. Cl.
*G11C 16/08*  (2006.01)
*G11C 16/04*  (2006.01)
*G11C 16/24*  (2006.01)

(52) U.S. Cl.
CPC .......... *G11C 16/08* (2013.01); *G11C 16/0483* (2013.01); *G11C 16/24* (2013.01)

(58) Field of Classification Search
CPC ..... G11C 5/145; G11C 16/0483; G11C 16/32; G11C 16/3427; G11C 16/30; G11C 16/08; G11C 16/24
See application file for complete search history.

(56) References Cited

U.S. PATENT DOCUMENTS 7,911,850 B2   3/2011  Chae et al.
9,679,660 B1 *  6/2017  Bae .......................... G11C 16/08
(Continued)

FOREIGN PATENT DOCUMENTS

CN       1983448 A     6/2007
CN     101194323 A     6/2008
(Continued)

OTHER PUBLICATIONS

International Search Report issued in corresponding International Application No. PCT/CN2021/121714 dated Jan. 6, 2022, 5 pages.

*Primary Examiner* — Tuan T Nguyen
(74) *Attorney, Agent, or Firm* — BAYES PLLC

(57) ABSTRACT

The present application discloses a non-volatile memory and an operating method of the non-volatile memory. The non-volatile memory includes a plurality of memory cells, and unselected word lines connected with the memory cells. The method includes applying a first voltage rising at a first slope to unselected word lines to charge the unselected word lines, and stopping applying the first voltage to the unselected word lines in response to that the first voltage rises to a predetermined voltage. The predetermined voltage is higher than a pass voltage of a plurality of memory cells connected with the unselected word lines.

20 Claims, 7 Drawing Sheets

(56) References Cited

U.S. PATENT DOCUMENTS

| | | | |
|---|---|---|---|
| 9,728,265 B2* | 8/2017 | Lee | G11C 16/08 |
| 10,176,872 B2* | 1/2019 | Lee | G11C 16/0483 |
| 10,269,570 B2* | 4/2019 | Lee | G11C 16/3459 |
| 2006/0092703 A1* | 5/2006 | Chae | G11C 16/10 |
| | | | 365/185.18 |
| 2007/0025155 A1* | 2/2007 | Hwang | G11C 16/10 |
| | | | 365/185.18 |
| 2012/0033501 A1* | 2/2012 | Park | G11C 16/0483 |
| | | | 365/185.18 |
| 2012/0300527 A1* | 11/2012 | Shim | G11C 16/10 |
| | | | 365/51 |
| 2014/0347935 A1* | 11/2014 | Kim | G11C 11/5642 |
| | | | 365/185.17 |
| 2019/0066793 A1* | 2/2019 | Shin | G11C 16/08 |
| 2020/0381063 A1* | 12/2020 | Kavalipurapu | G11C 16/32 |

FOREIGN PATENT DOCUMENTS

| | | |
|---|---|---|
| CN | 102376357 A | 3/2012 |
| CN | 103514952 A | 1/2014 |
| CN | 107025923 A | 8/2017 |
| CN | 108417238 A | 8/2018 |
| CN | 109074848 A | 12/2018 |
| CN | 109786388 A | 5/2019 |
| CN | 109817635 A | 5/2019 |
| CN | 111292777 A | 6/2020 |
| CN | 112435704 A | 3/2021 |
| KR | 1020190023893 A | 3/2019 |

* cited by examiner

NON-VOLATILE MEMORY AND OPERATING METHOD THEREOF

CROSS-REFERENCE TO RELATED APPLICATIONS

This application is a continuation of International Application No. PCT/CN2021/121714, filed on Sep. 29, 2021, which claims the benefit of priority to C.N. Application No. 202011419073.6, filed on Dec. 7, 2020, both of which are hereby incorporated by reference in their entireties.

BACKGROUND

The present disclosure relates to a non-volatile memory, and a method of performing read and verification operations for the non-volatile memory.

Non-volatile semiconductor memories are widely used in cell phones, digital cameras, personal digital assistants, mobile computing devices, non-mobile computing devices, and other devices. Non-volatile memories retain data in the case of a sudden power failure or power-off. A flash memory is a non-volatile memory widely used currently. In order to further increase the bit density of flash devices and reduce their cost, three-dimensional (3D) flash memories are developed.

Taking non-volatile memories as an example, electrons move between channels and floating gates of memory cells through an FN tunneling mode when a program (write) operation is performed. After entering the floating gates, the electrons will be confined in the floating gates if they do not regain enough energy to run through tunneling layers, so that the floating gates can achieve an effect of storing charge. When a program verification (read) operation is performed, a quantity of charge on the floating gates may be determined by supplying a required voltage to word lines of the corresponding memory cells, thereby determining storage states of the memories. However, in such operations, for example, when a voltage is supplied to unselected word lines to expect to boost their voltage to a pass voltage during the read operation, the read or verification operation may not be correctly performed possibly because it is too slow to boost the voltage of the unselected word lines to the pass voltage due to a magnitude or a duration of the voltage supplied.

SUMMARY

Embodiments of the present application aim at providing a non-volatile memory which is capable of rapidly boosting the voltage on unselected word lines to a pass voltage during a read operation.

Furthermore, embodiments of the present application aim at providing a method of performing a read operation for a non-volatile memory to allow a voltage on unselected word lines to effectively rise during the read operation.

According to one aspect of the present disclosure, a method of performing a read operation for a non-volatile memory is disclosed, the non-volatile memory comprising a plurality of memory cells, and a plurality of word lines respectively connected with the memory cells, wherein the read operation is performed for the corresponding memory cells by selecting at least one of the word lines, the method comprising: applying a first voltage rising at a first slope to unselected word lines among a plurality of word lines to charge the unselected word lines to allow a second voltage on the unselected word lines to rise at a second slope, the first slope being greater than the second slope; and stopping applying the first voltage to the unselected word lines in response to that the first voltage rises to a predetermined voltage, wherein the predetermined voltage is higher than the pass voltage for turning on the memory cells connected with the unselected word lines, and the second voltage is not higher than the pass voltage.

In embodiments, the second voltage on the unselected word lines is greater than 85% of the pass voltage when the first voltage rises to the predetermined voltage.

In embodiments, the non-volatile memory further comprises a first drive circuit including a comparator. Applying the first voltage rising at the first slope to the unselected word lines among the plurality of word lines may comprise: inputting a ramp voltage rising with time, and a boosted drive voltage to the comparator to allow the comparator to output a pulse signal; and determining whether to apply the first voltage to the unselected word lines based on the pulse signal.

In embodiments, a level of the pulse signal is high when the ramp voltage is lower than the boosted drive voltage; otherwise, the level of the pulse signal is low. In embodiments, the boosted drive voltage is 7V.

In embodiments, the ramp voltage is lower than the drive voltage before the first voltage rises to the predetermined voltage; and the ramp voltage is higher than the drive voltage after the first voltage rises to the predetermined voltage.

In embodiments, the first drive circuit further comprises a voltage source, and a first switch cell receiving the pulse signal from the comparator. Determining whether to apply the first voltage to the unselected word lines based on the pulse signal comprises: electrically connecting the voltage source with the unselected word lines through the first switch cell in response to that the pulse signal input to the first switch cell is at a high level, to allow the voltage source to apply the first voltage to the unselected word lines.

In embodiments, determining whether to apply the first voltage to the unselected word lines based on the pulse signal further comprises: turning off the first switch cell in response to that the pulse signal input to the first switch cell is at a low level, such that the voltage source stops applying the first voltage to the unselected word lines.

In embodiments, the non-volatile memory further comprises a second drive circuit. The method further comprises: applying the pass voltage to the unselected word lines through the second drive circuit when stopping applying the first voltage to the unselected word lines.

In embodiments, the second drive circuit comprises an error amplifier, and a plurality of resistors connected with the error amplifier. Applying the pass voltage to the unselected word lines through the second drive circuit of the non-volatile memory comprises: inputting a reference voltage to a positive input terminal of the error amplifier; and outputting the pass voltage based on the reference voltage and resistance values of the plurality of resistors, and applying the pass voltage to the unselected word lines.

In embodiments, the pulse signal keeps at the high level before the first voltage rises to the predetermined voltage.

In embodiments, the pulse signal keeps at the low level after the first voltage rises to the predetermined voltage.

In embodiments, the method further comprises: applying a read voltage to selected word lines among the plurality of word lines to read data.

According to another aspect of the present disclosure, a non-volatile memory comprises: a plurality of memory cells; a plurality of word lines connected with the plurality of memory cells; a voltage generator connected to the plurality of memory cells and configured to supply a voltage to the plurality of memory cells; and a controller connected with the voltage generator.

The controller controls the voltage generator to apply a first voltage rising at a first slope to unselected word lines among the plurality of word lines to charge the unselected word lines to allow a second voltage on the unselected word lines to rise at a second slope, the first slope being greater than the second slope; and stop applying the first voltage to the unselected word lines in response to that the first voltage rises to a predetermined voltage, wherein the predetermined voltage is higher than a pass voltage for turning on the memory cells connected with the unselected word lines, and the second voltage is not higher than the pass voltage.

In embodiments, the voltage generator further comprises a first drive circuit including a comparator. The first drive circuit may receive a ramp voltage rising with time, and a boosted drive voltage through the comparator to allow the comparator to output a pulse signal; and determine whether to apply the first voltage to the unselected word lines based on the pulse signal.

In embodiments, the first drive circuit further comprises a voltage source, and a first switch cell receiving the pulse signal from the comparator. The first switch cell may connect the voltage source with the unselected word lines in response to that the pulse signal is at a high level, to allow the voltage source to apply the first voltage to the unselected word lines.

In embodiments, the first switch cell may disconnect the voltage source from the unselected word lines in response to that the pulse signal input to the first switch cell is at a low level, such that the voltage source stops applying the first voltage to the unselected word lines.

In embodiments, the voltage generator further comprises a second drive circuit. The second drive circuit may apply the pass voltage to the unselected word lines in response to that the first drive circuit stops applying the first voltage to the unselected word lines.\

In embodiments, the second drive circuit comprises an error amplifier, and a plurality of resistors connected with the error amplifier. The second drive circuit may be further configured to: receive a reference voltage through a positive input terminal of the error amplifier; and output the pass voltage based on the reference voltage and resistance values of the plurality of resistors, and apply the pass voltage to the unselected word lines.

BRIEF DESCRIPTION OF THE DRAWINGS

Other features, purposes and advantages of the present application will become more apparent by reading the detailed description of non-limitative embodiments made by reference to the following figures.

DETAILED DESCRIPTION

Figure 1:
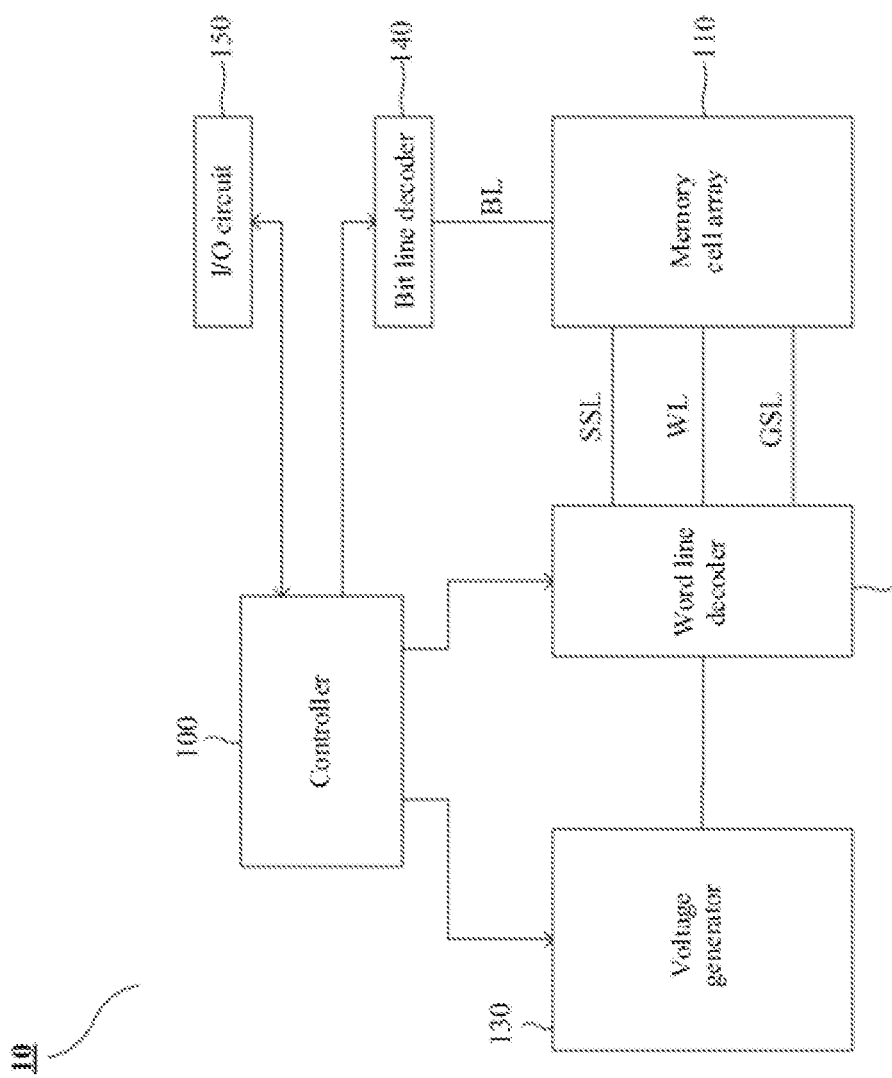
FIG. 1 is a block diagram illustrating a non-volatile memory according to embodiments of the present disclosure.

In order for better understanding of the present application, respective aspects of the present application will be described in more detail by reference to the drawings. It is understood that, these detailed descriptions merely describe exemplary embodiments of the present application, instead of restricting the scope of the present application in any manner. Like reference numbers denote like elements throughout the specification. The expression "and/or" includes any or all combinations of one or more of listed associated items.

For ease of description, the sizes, dimensions and shapes of elements have been adjusted in the figures. The figures are merely exemplary and are not drawn to scale strictly, and relative dimensions, scales and depictions of elements may be exaggerated in the figures. Like reference numbers denote like elements throughout all the figures and the detailed description.

As used herein, terms "approximately", "about", and similar terms, are used to represent approximation, instead of representing a degree, and are intended to describe an inherent deviation in a measured value or a calculated value as recognized by those of ordinary skill in the art. Furthermore, in the present application, the sequential order of the description of respective step processes do not necessarily represent an order of these processes in practical operation, unless otherwise expressly defined or can be derived from the context.

It is also understood that, expressions, such as "comprise", "comprising", "have", "include", and/or "including", etc., are open-ended expressions in the present description, rather than close-ended expressions. They represent that there exist the stated features, elements and/or components, but the existence of one or more other features, elements, components and/or combinations thereof is not precluded. Moreover, the expression, such as "at least one of . . . ", appearing after a list of listed features, modifies the whole list of features, rather than an individual feature therein. Furthermore, "may" is used to represent "one or more embodiments of the present application" when embodiments of the present application are described. Moreover, the term "exemplary" is intended to refer to an example or exemplification.

Unless otherwise defined, all phraseologies (including engineering terms and technical terms) as used herein have the same meanings as those generally understood by those of ordinary skill in the art to which the present application pertains. It is further understood that, terms as defined in common dictionaries should be interpreted as having a meaning that is consistent with their meaning in the context of the relevant art, and should not be interpreted in an idealized or overly formal sense unless otherwise stated expressly in the present application.

It should be noted that, embodiments and features in the embodiments of the present application may be mutually combined in the case of no conflicts. The present application will be detailed below by reference to the drawings and in conjunction with the embodiments.

Embodiments will be detailed blow by reference to the drawings. For ease of understanding, a 3D NAND memory as a non-volatile memory example is described below.

However, the present application is not limited to this, and the present application may be applied to any known non-volatile memory in the art in which turn-on of memory cells is controlled by a word line voltage.

FIG. 1 is a block diagram illustrating a 3D NAND memory 10 according to embodiments of the present disclosure.

Referring to FIG. 1, a 3D NAND memory 10 may comprise a controller 100, a memory cell array 110, a word line decoder 120, a voltage generator 130, a bit line decoder 140 and an input/output (I/O) circuit 150.

According to various exemplary embodiments, the controller 100 may control the voltage generator 130, the word line decoder 120 and the bit line decoder 140 to perform erase, write, read and/or verification operations for the 3D NAND memory 10 in response to a control signal transmitted from outside. When the erase, write, read and/or verification operations are required to be performed for one or more memory cells, the controller 100 may transmit addresses of the one or more memory cells to the bit line decoder 140 and the word line decoder 120 for addressing by the bit line decoder 140 through bit lines BL, and for addressing by the word line decoder 120 through word lines WL. The controller 100 may transmit a control signal to the voltage generator 130. The controller 100 may be implemented in the 3D NAND memory 10 as hardware or software, or in a form of a combination of the hardware and software. For example, more particularly, the controller 100 may include, but not limited to, a central processing unit (CPU), an arithmetic logic unit (ALU), a digital signal processor, a microcomputer, a field programmable gate array (FPGA), a system on chip (SoC), a programmable logic unit, a microprocessor, an application-specific integrated circuit (ASIC), etc.

According to exemplary embodiments, the voltage generator 130 may generate various voltages for performing the write, read and erase operations for the memory cell array 110. For example, during the read operation, the voltage generator 130 may generate a read voltage to be applied to selected word lines, and a pass voltage to be applied to unselected word lines. In embodiments, the controller 100 may control the voltage generator 130 to generate the above various voltages.

According to exemplary embodiments, during the write operation, the bit line decoder 140 may transmit a bit line voltage corresponding to data to be written into bit lines of the memory cell array 110. During the read operation or the verification operation, the bit line decoder 140 may sense the data stored in the memory cells on the corresponding bit lines according to different read operation methods, thereby reading data stored in the 3D NAND memory 10.

According to exemplary embodiments, during the write operation, the data to be written into the memory cell array 110 may be supplied to the memory 10 via the input and output circuit 150. During the read operation, the data read from the memory cell array 110 may be supplied to the outside of the memory 10 via the bit line decoder 140 and the input and output circuit 150.

According to exemplary embodiments, during the read or write operation, at least one word line connected to the memory cells to be operated among multiple word lines may be selected through the word line decoder 120. During the write operation, the word line decoder 120 may apply a programing voltage to the selected word lines, and may apply a pass voltage to the unselected word lines. During the read operation, the word line decoder 120 may apply a read voltage to the selected word lines, and may apply a pass voltage to the unselected word lines.

Figure 2:
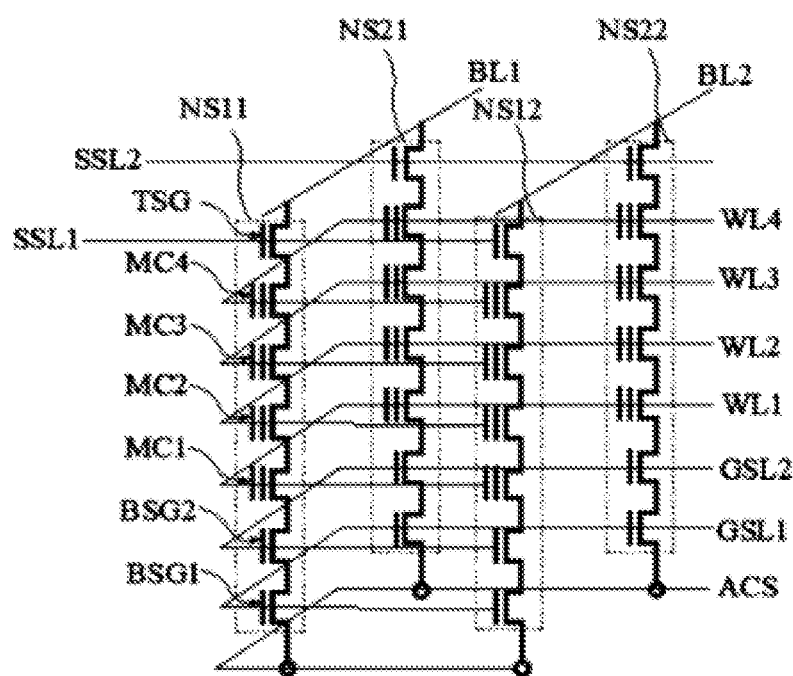
FIG. 2 is a circuit schematic diagram illustrating a memory block in a non-volatile memory according to embodiments of the present disclosure.

FIG. 2 is a circuit schematic diagram illustrating a memory block 200 in a 3D NAND memory according to embodiments of the present disclosure.

The 3D NAND memory 10 comprises a plurality of memory blocks. Each memory block comprises a plurality of memory cells distributed in a three-dimensional space, constituting a plurality of memory strings. Channels of the memory cells located in the same memory string are connected physically.

In the memory block 200 as shown in FIG. 2, memory strings NS11 and NS21 are connected to a first bit line BL1 and arranged between the first bit line BL1 and a common source line ACS; memory strings NS12 and NS22 are connected to a second bit line BL2 and arranged between the second bit line BL2 and the common source line ACS. A top select transistor TSG for each memory string is connected to the corresponding bit line; a bottom select transistor BSG for each memory string is connected to the common source line ACS, and multiple memory cells MC1-MC4 are arranged between the top select transistor TSG and the bottom select transistor BSG of each memory string. The memory strings NS11, NS12 are connected to a first string select line SSL1, and the memory strings NS21, NS22 are connected to a second string select line SSL2.

Multiple memory cells located in the same layer constitute a memory page, and gates of the memory cells located in different memory strings but in the same memory page are connected physically, and connected to the same word line. As shown in FIG. 2, the word lines WL with the same height are in common connection. When the read operation is performed for some memory cell of the memory block, a memory string and a page where the memory cell to be operated (hereinafter referred to as a selected memory cell) is located should be determined.

The memory string where the selected memory cell is located is called as a selected string, and the page where it is located is called as a selected page. The selected string may be determined through the string select lines SSL1 and SSL2, and the bit lines BL1 and BL2, and the selected page may be determined through the word lines WL1-WL4, thereby determining some specific selected memory cell.

It should be noted that, for the sake of simplification, FIG. 2 only illustrates a situation where four memory strings (NS11, NS21, NS12, NS22), two bit lines (BL1, BL2), four word lines (WL1, WL2, WL3, WL4), two string select lines (SSL1, SSL2), and two ground select lines (GSL1, GSL2) are included. However, it may be understood by those skilled in the art that, in practical applications, the numbers of the memory strings, bit lines, word lines, string select lines and source select lines may be set as required and are not limited to those described herein. It may be understood as well that, the bottom select gates BSG in each memory string may also include three or more, and the number of memory cells MC in each memory string may also be adjusted as required. As an example, each memory cell may be a one-bit memory cell or a multi-bit memory cell.

Figure 3:
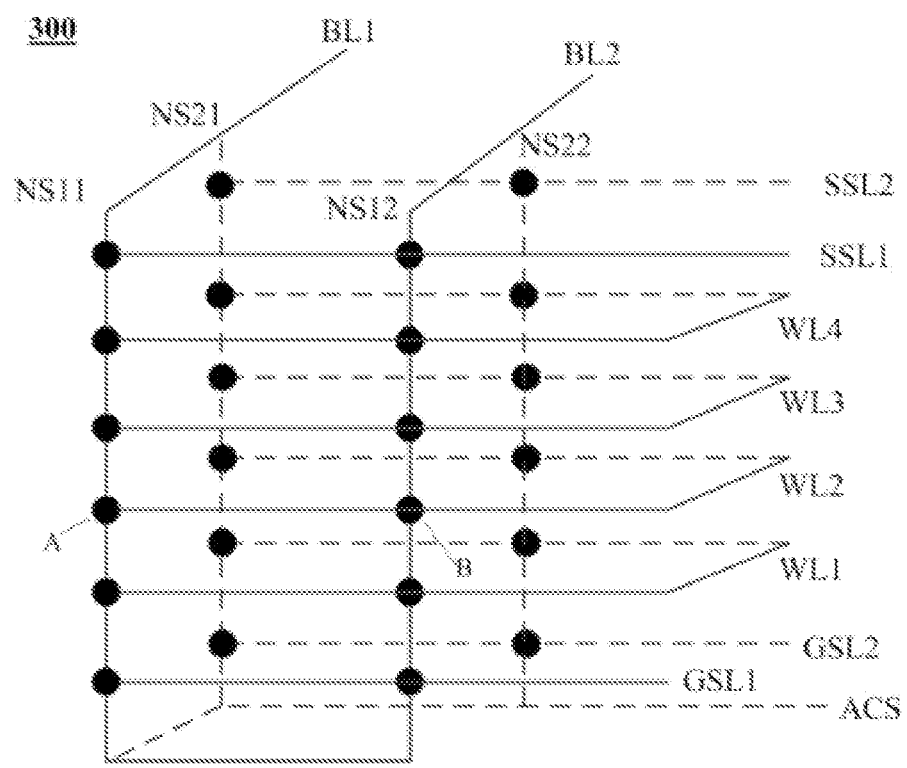
FIG. 3 is an equivalent circuit diagram illustrating the memory block of FIG. 2 when performing a read operation, according to embodiments of the present disclosure.

FIG. 3 illustrates an equivalent circuit diagram 300 of the memory block of FIG. 2 when performing a read operation, according to embodiments of the present disclosure. As an example, reading for memory cells A and B in memory strings NS11 and NS12 is taken as an example.

During the read operation, as shown in FIG. 3, the memory strings NS11 and NS12 where the memory cells A and B are located are selected memory strings, and other memory strings NS21 and NS22 are unselected strings. A first string select line SSL1 is a selected string select line SSL_SEL, and a second string select line SSL2 is an unselected string select line SSL_UN. A first ground select line GSL1 is a selected ground select line GSL_SEL, and a second ground select line GSL2 is an unselected ground select line GSL_UN. A second word line WL2 is a selected word line WL_SEL, a first word line WL1 and a third word line through a fourth word line WL3-WL4 are unselected word lines WL_UN.

The controller 100 may control the voltage generator 130 and the word line decoder 120 to apply a pass voltage to the selected string select line SSL_SEL and the selected ground select line GSL_SEL to turn on transistors controlled by the selected string select line SSL_SEL and the selected ground select line GSL_SEL.

The controller 100 may control the voltage generator 130 and the word line decoder 120 to apply a cut-off voltage to the unselected string select line SSL_UN and the unselected ground select line GSL_UN to turn off transistors controlled by the unselected string select line SSL_UN and the unselected ground select line GSL_UN, thereby avoiding turning on a channel of the unselected memory string.

The controller 100 may control the voltage generator 130 and the word line decoder 120 to apply a pass voltage to the unselected word lines WL_UN, thereby turning on the channel of the selected memory string, and to apply a read voltage to the selected word line WL_SEL to read data in the selected memory cells.

Figure 4:
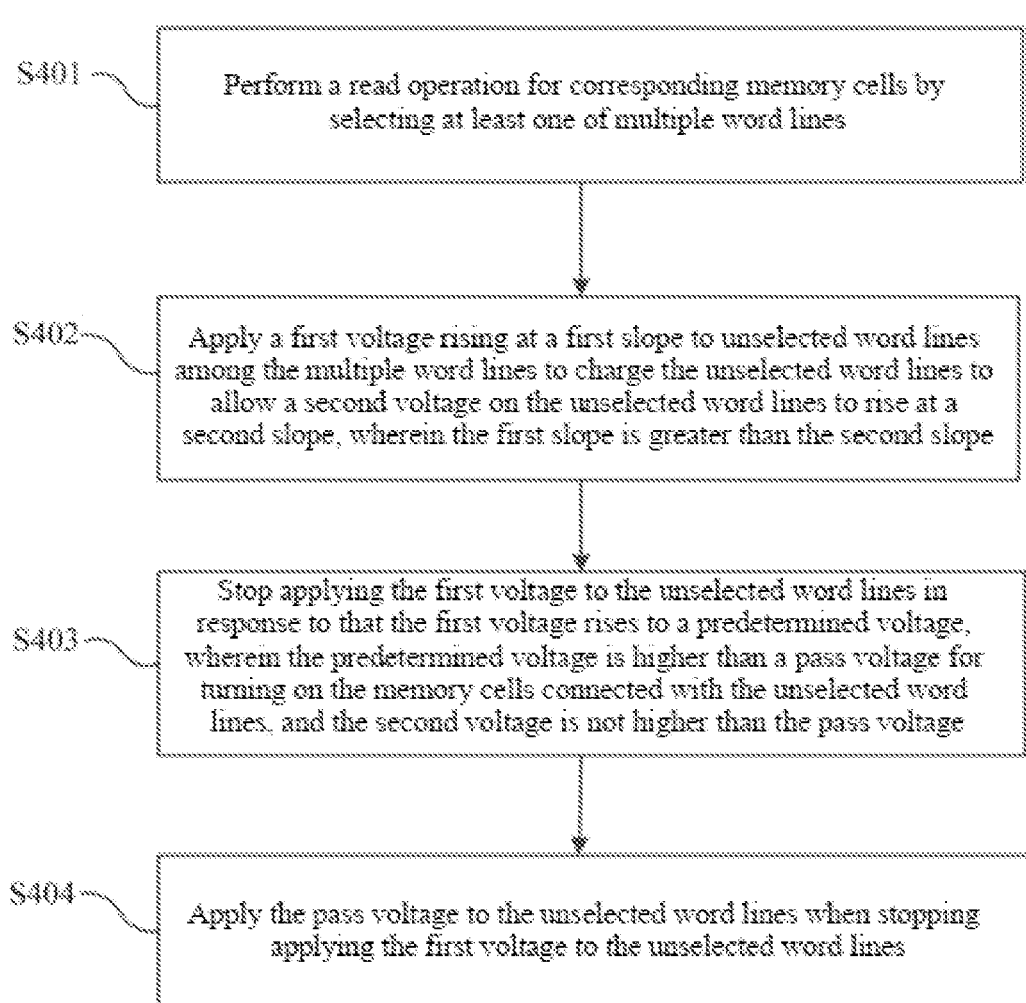
FIG. 4 is a flow diagram illustrating a read method of a non-volatile memory according to embodiments of the present disclosure.

FIG. 4 is a flow diagram illustrating a read method 400 of a 3D NAND memory according to embodiments of the present disclosure.

As shown in FIG. 4, at Step S401, a read operation is performed for corresponding memory cells by selecting at least one of multiple word lines.

According to exemplary embodiments, the controller 100 of the 3D NAND memory 10 may control the read operation of the 3D NAND memory 10 based on a read request received from an external device (e.g., an external host). The controller 100 may control the word line decoder 120 to select at least one word line connected with the memory cells to be read from multiple word lines WL in response to address information received from the external device.

The controller 100 may control to apply a read voltage to the selected word lines.

At Step S402, a first voltage rising at a first slope is applied to unselected word lines among multiple word lines to charge capacitors equivalent to the unselected word lines to allow a second voltage on the unselected word lines to rise at a second slope, wherein the first slope is greater than the second slope.

In embodiments, the controller 100 may control the voltage generator 130 to output the first voltage rising at the first slope, and apply the first voltage to the unselected word lines.

According to exemplary embodiments, the word lines may be modeled to comprise capacitors, that is, the word lines may be equivalent to capacitors. The voltage generator 130 may transmit the first voltage rising at the first slope to the unselected word lines modeled as capacitors to charge the word lines modeled as the capacitors. According to embodiments, the voltage on the unselected word lines (i.e., voltage on the capacitors) gradually rises at the second slope for being charged, and the second slope is less than the first slope at which the first voltage rises. In other words, a voltage rising rate on the word lines is less than a rising rate of the first voltage.

At Step S403, application of the first voltage to the unselected word lines is stopped in response to that the first voltage rises to a predetermined voltage, wherein the predetermined voltage is higher than a pass voltage for turning on the memory cells connected with the unselected word lines, and the second voltage is not higher than the pass voltage.

According to exemplary embodiments, the controller 100 may control the voltage generator 130 to stop applying the first voltage to the unselected word lines when the first voltage rises to the predetermined voltage (i.e., when a voltage value of the first voltage is equal to a predetermined value as the first voltage rises). The predetermined voltage is higher than the pass voltage, wherein the pass voltage refers to a voltage that can turn on the memory cells (hereinafter referred to as unselected memory cells) connected with the unselected word lines. As described above, since the channels of the memory cells located in the same memory string are connected physically, the channels of the selected memory strings need to be turned on by applying the pass voltage to the unselected word lines when the read operation is performed. For example, the pass voltage may be 7 V.

A voltage value of the second voltage on the unselected word lines is less than the pass voltage when the first voltage rises to the predetermined voltage. In other words, the voltage generator 130 transmits the first voltage rising at the first slope to the unselected word lines to charge them. As charging proceeds, the voltage on the unselected word lines rises at the second slope less than the first slope. The voltage on the unselected word lines does not exceed the pass voltage when the first voltage rises to the predetermined voltage. In embodiments, the voltage on the unselected word lines may be greater than 85% of the pass voltage but lower than the pass voltage when the first voltage rises to the predetermined voltage. However, the present disclosure is not limited to this.

At Step S404, the pass voltage is applied to the unselected word lines when the application of the first voltage to the unselected word lines is stopped. When the first voltage rises to the predetermined voltage, and accordingly, the voltage generator 130 stops applying the first voltage to the unselected word lines, the controller 100 may control the voltage generator 130 to apply the pass voltage to the unselected word lines to continue charging the unselected word lines. After a period of charging time, the voltage on the unselected word lines rises to the pass voltage and maintains at the pass voltage.

Figure 5A:
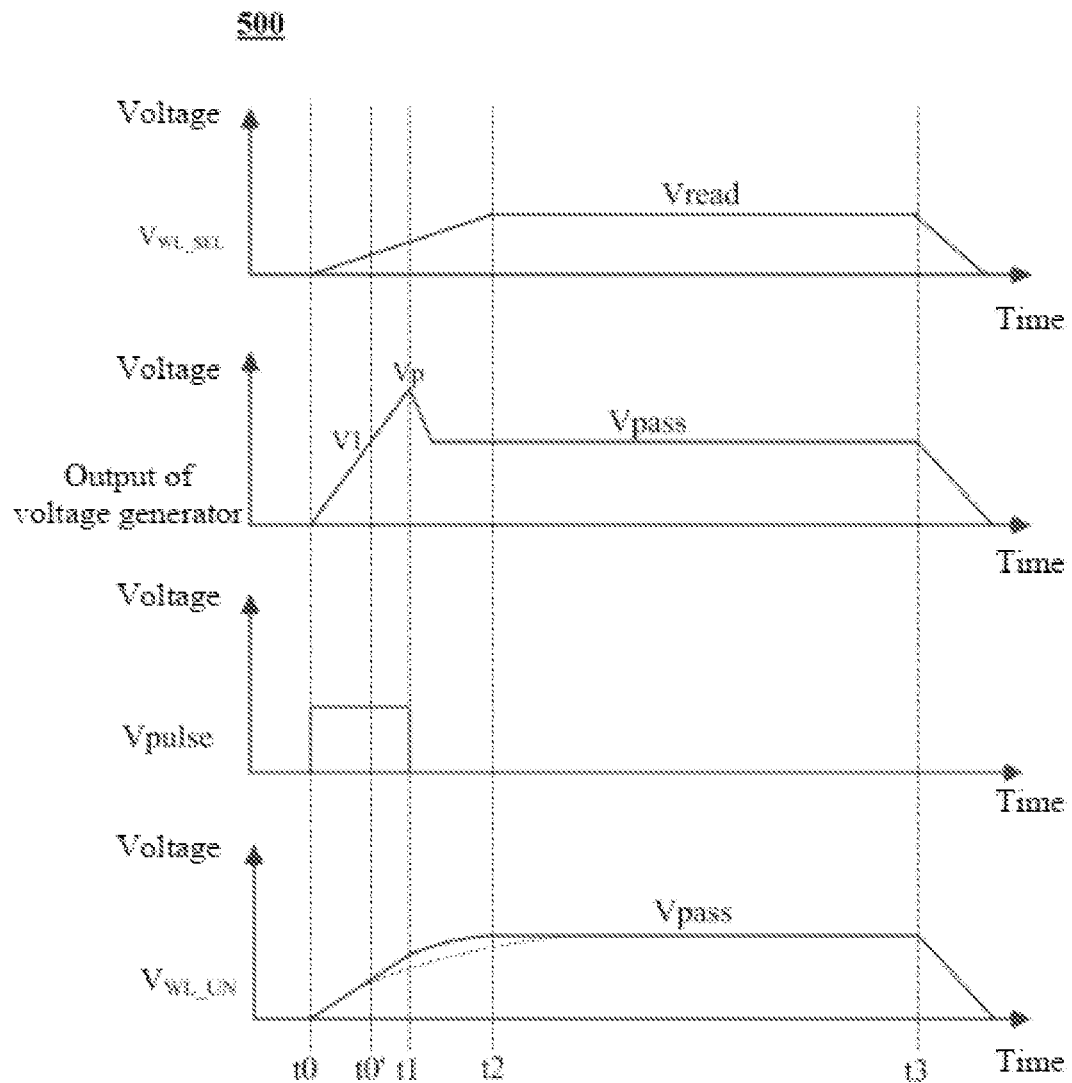
FIG. 5A is a waveform sequence illustrating the performing of the read method of FIG. 4, according to embodiments of the present disclosure.

FIG. 5A is a waveform sequence diagram 500 illustrating the performing of the read method of FIG. 4, according to embodiments of the present disclosure.

Referring to FIG. 5A, at a pre-pass stage (a time period t0 to t2) of the read operation, the voltage generator 130 may apply a read voltage Vread to the selected word line WL_SEL to permit a voltage $V_{WL\_SEL}$ on the selected word line to gradually rise to the read voltage.

At a time period t0 to t1, the voltage generator 130 may transmit the first voltage V1 rising at the first slope to the unselected word lines WL_UN to charge them. In embodiments, the first slope has an approximately constant value at the time period t0 to t1. That is, a value of the first voltage V1 increases diagonally.

At the time period t0 to t1, due to being charged, the voltage $V_{WL\_UN}$ on the unselected word lines rises at the second slope less than the first slope.

At time t1, the first voltage V1 output by the voltage generator 130 reaches the predetermined voltage Vp. At that time, the voltage $V_{WL\_UN}$ on the unselected word lines does not reach the pass voltage Vpass, but approaches it. In embodiments, the pass voltage Vpass may be, for example, 7 V. In embodiments, at that time, the voltage $V_{WL\_UN}$ on the unselected word lines may be, for example, above 85% of the pass voltage Vpass. At the time t1, the voltage generator 130 stops outputting the first voltage V1, and starts to output the pass voltage Vpass lower than the predetermined voltage.

At a time period t1 to t2, the voltage generator 130 may generate the pass voltage Vpass lower than the predetermined voltage Vp, and apply the pass voltage Vpass to the unselected word lines WL_UN to continue charging the unselected word lines WL_UN.

At the time period t1 to t2, due to the charge, the voltage $V_{WL\_UN}$ on the unselected word lines gradually rises to the pass voltage Vpass.

In other words, starting from the time t1, the voltage generator 130 stops supplying the first voltage V1, and continues charging the unselected word lines WL_UN through the pass voltage Vpass lower than the predetermined voltage Vp. If the first voltage V1 with a relatively high voltage value continues to be applied to the unselected word lines WL_UN after the time t1, it may cause the voltage on the unselected word lines to exceed the pass voltage due to overcharge. If the first voltage V1 is cut off and it turns to supply the pass voltage Vpass to the unselected word lines when the first voltage V1 rises to the pass voltage Vpass (i.e., at time t0'), then the voltage on the unselected word lines rises slowly at a time period t0' to t1 (as shown by a dotted line in FIG. 5A), so that the voltage on the unselected word lines cannot rise to the pass voltage Vpass within a predetermined time, thereby affecting the subsequent read operation. The method of applying the voltage according to the embodiments of the present disclosure can shorten a duration required for the voltage on the unselected word lines to rise to the pass voltage.

Thus, as compared with the prior art which provide a fixed voltage source to unselected word lines during read, provision of the first voltage higher than the pass voltage to the unselected word lines according to embodiments of the present disclosure enables the voltage on the word lines to rise to the pass voltage more quickly, and saves the time (e.g. tProg and tR) for storing data to the non-volatile memory and reading data from the non-volatile memory; meanwhile, when the voltage on the word lines rises to about 85% of the pass voltage, the first voltage is cut off, and it turns to continue charging the word lines with the pass voltage, which can avoid overcharge for the word lines. According to embodiments of the present disclosure, the voltage on the unselected word lines can rise to the pass voltage quickly, thereby avoiding the problem that the voltage on the unselected word lines cannot be boosted effectively when a duration of the pre-pass stage is shortened, and accordingly, channels cannot be reset effectively.

At a time period t2 to t3, the voltage on the unselected word lines rises to the pass voltage, the unselected memory cells are in an on state, and the controller 100 may control the bit line decoder 140 to sense data stored in the selected memory cells via bit lines to achieve the read of the data.

Figure 5B:
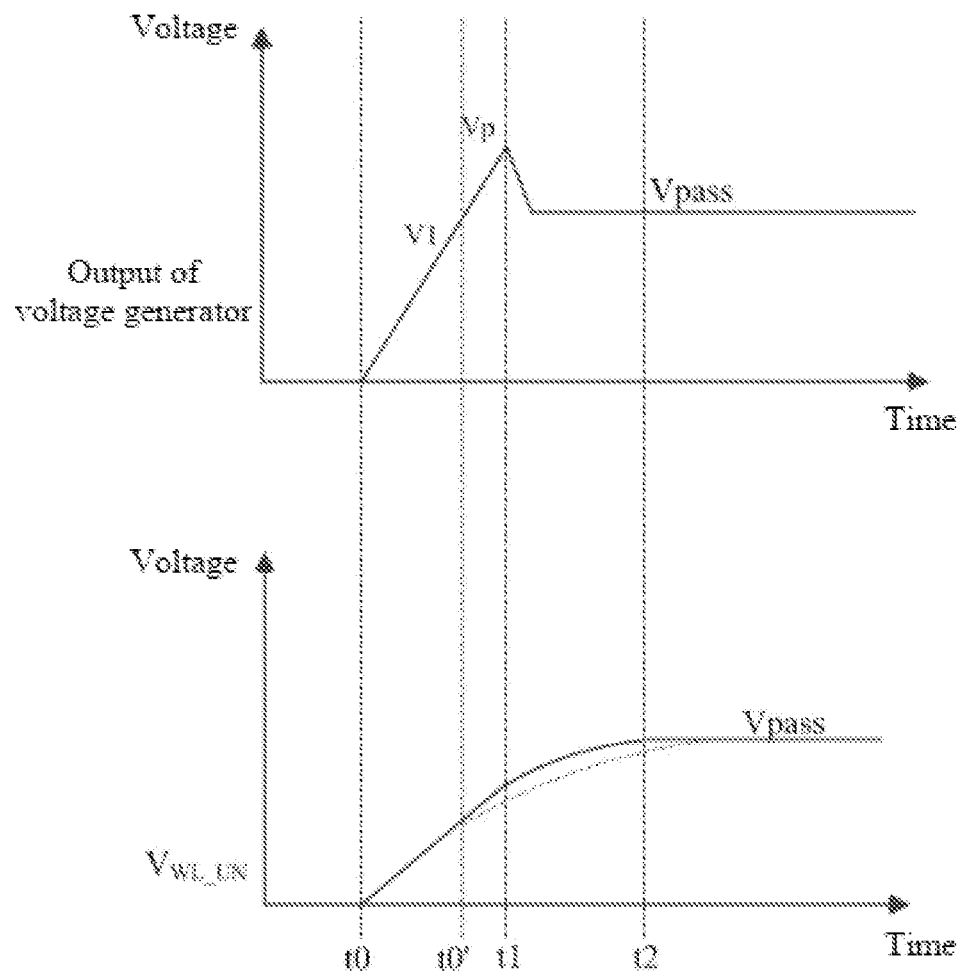
FIG. 5B is an enlarged diagram illustrating an output voltage of a voltage generator and a rise of a voltage on unselected word lines when performing the read method of FIG. 4, according to embodiments of the present disclosure.

FIG. 5B is an enlarged diagram illustrating an output voltage of a voltage generator and a rise of a voltage on unselected word lines when performing the read method of FIG. 4, according to embodiments of the present disclosure.

As described above, at the time period t0 to t1, the unselected word lines WL_UN are changed by the first voltage V1 rising at the first slope, and the voltage $V_{WL\_UN}$ on the unselected word lines rises at the second slope less than the first slope. Referring to FIG. 5B, the first slope has an approximately constant value at the time period t0 to t1, that is, a value of the first voltage V1 increases diagonally. The second slope has an approximately constant value at the time period t0 to t1, that is, a value of the voltage $V_{WL\_UN}$ on the unselected word lines increases diagonally.

From the time t1 to the time t2, the voltage generator 130 stops applying the first voltage to the unselected word lines WL_UN, while applies the pass voltage Vpass to the unselected word lines WL_UN to continue charging the unselected word lines WL_UN.

Referring to FIG. 5B, at the time period t1 to t2, since the constant pass voltage Vpass, instead of the first voltage rising gradually, is received from the voltage generator 130, the increase rate of the value of the voltage $V_{WL\_UN}$ on the unselected word lines is slowed down, presenting as an approximately ramped arc. It is understood that, the diagonal form or the arc form of the rise of the voltage is merely exemplary, and the present disclosure is not limited to this.

Figure 6:
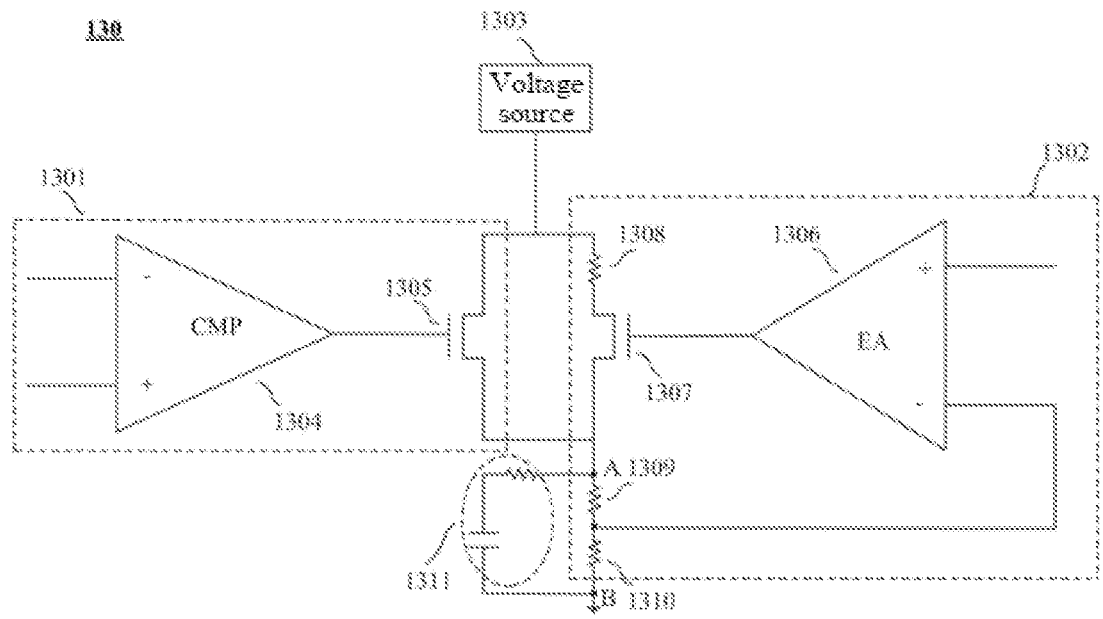
FIG. 6 is a block diagram illustrating a voltage generator according to embodiments of the present disclosure.

FIG. 6 illustrates a block diagram of a voltage generator 130 according to embodiments of the present disclosure.

As shown in FIG. 6, the voltage generator 130 may comprise a first drive circuit 1301, a second drive circuit 1302, and a voltage source 1303.

The voltage source 1303 may supply various kinds of voltages, for example, a voltage rising or dropping with time, a constant voltage, etc.

The voltage generator 130 may generate various voltages, e.g., a write voltage, a read voltage, a pass voltage, a verification voltage or a recovery voltage, for performing write, read and erase operations through the first drive circuit 1301 and the second drive circuit 1302 based on the voltage source 1303.

In embodiments, the voltage generator 130 may generate a first voltage rising at a first slope through the first drive circuit 1301 and the voltage source 1303, and apply the first voltage to an unselected word line 1311. In embodiments, the unselected word line 1311 may be modeled as a capacitor.

In embodiments, the voltage generator 130 may generate a pass voltage through the second drive circuit 1302 and the voltage source 1303, and apply the pass voltage to the unselected word line 1311.

The voltage generator 130 may further comprise generating during operation voltages for string select lines and ground select lines, etc., description of which is omitted herein.

The first drive circuit 1301 may comprise a comparator 1304, and a first switch cell 1305 receiving a pulse signal from the comparator.

The comparator 1304 may receive a boosted drive signal from its positive input terminal, and receive a ramp voltage rising with time from its negative input terminal. The comparator 1304 may compare the drive signal and the ramp voltage, and output a pulse signal based on a comparison result. In embodiments, the pulse signal is a digital signal.

In embodiments, a level of the output pulse signal is high when the ramp voltage is lower than the boosted drive voltage; a level of the output pulse signal is low when the ramp voltage is higher than the boosted drive voltage.

The first switch cell 1305 may be connected to the voltage source 1303 and the unselected word line 1311, and may determine whether to connect the voltage source 1303 with the unselected word line 1311 based on the pulse signal received from an output of the comparator 1304.

Referring back to FIG. 5A, at the time period t0 to t1, the voltage generator 130 applies the first voltage rising at the first slope to the unselected word line 1311.

Specifically, at the time period t0 to t1, the ramp voltage Vr input to the comparator 1304 is set to be less than the boosted drive voltage Vd. For example, in conjunction with FIG. 7, the ramp voltage Vr is set to rise with time, and the drive voltage Vd is set to have a constant voltage value. Vd is, for example, 7 V. At the time t0, the ramp voltage Vr starts to rise from 0 V. When the time t1 is reached, the ramp voltage Vr rises to be equal to the drive voltage Vd, that is, the value of the ramp voltage is also Vd at that time. At the time period t0 to t1, the ramp voltage is lower than the drive voltage Vd, and the pulse signal Vpulse output by the comparator 1304 is at a high level. At that time, at the time period t0 to t1, the first switch cell 1305, e.g., an MOS transistor, may be turned on since a high level is applied to its gate, and the voltage rising at the first slope output by the voltage source 1303 is applied as the first voltage to the unselected word line 1311, i.e., a near end A of the unselected word line 1311. The pulse signal keeps at the high level before the first voltage rises to the predetermined voltage. During that time, the voltage on the unselected word line 1311 (i.e., a far end B of the unselected word line 1311) rises at the second slope.

At the time period t1 to t2, the voltage generator 130 applies the pass voltage to the unselected word line 1311.

Figure 7:
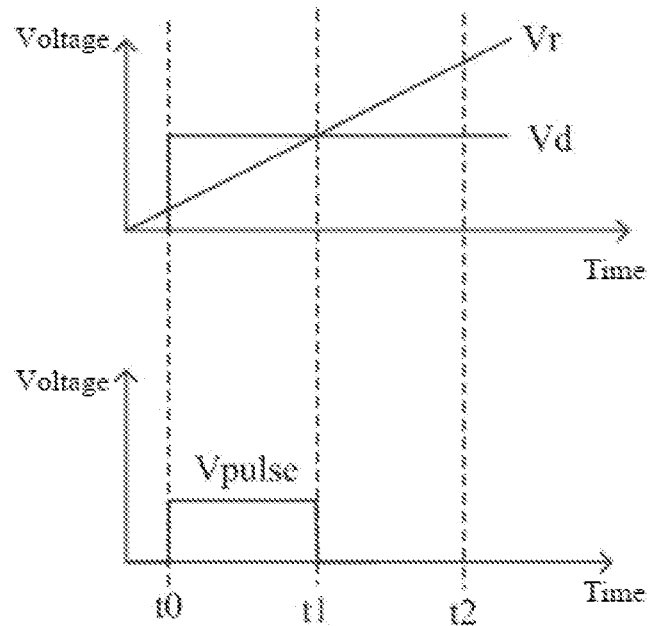
FIG. 7 is a schematic diagram illustrating a working principle of a comparator in a voltage generator according to embodiments of the present disclosure.

Specifically, in conjunction with FIG. 7, the ramp voltage Vr has reached the drive voltage Vd at time t1, and will continue rising at the time period t1 to t2 and is higher than Vd all the time. In this case, the ramp voltage Vr is higher than the drive voltage Vd, and the pulse signal Vpulse output by the comparator 1304 is at a low level (as shown in FIG. 7). At that time, at the time period t1 to t2, the first switch cell 1305, e.g., the MOS transistor, may be turned off since the low level is applied to its gate. At that time, the voltage output by the voltage source 1303 cannot be applied to the unselected word line through the first drive circuit 1301. The voltage output by the voltage source 1303 is be applied through the second drive circuit 1302. The pulse signal keeps at the low level after the first voltage rises to the predetermined voltage.

According to other embodiments, the drive voltage Vd may drop after the time t1 to control a component voltage between resistors 1309 and 1310 of the second drive circuit 1302 when the voltage is applied to the unselected word line through the second drive circuit 1302.

According to embodiments of the present disclosure, the ramp voltage is lower than the drive voltage before the first voltage rises to the predetermined voltage; and the ramp voltage is higher than the drive voltage after the first voltage rises to the predetermined voltage.

According to embodiments of the present disclosure, in the case where the ramp voltage is given, the first switch cell 1305 may be controlled to be turned on or off by adjusting a magnitude of the drive voltage, to further control whether to apply the first voltage rising continuously to the unselected word line. If it is desired to apply the first voltage with a higher voltage value or a longer duration to the unselected word line, then it may be implemented by further boosting the drive voltage. If it is desired to apply the first voltage with a lower voltage value or a shorter duration to the unselected word line, then it may be implemented by reducing the drive voltage.

According to embodiments of the present disclosure, the duration when the pulse signal is at the high level may be longer by setting the drive voltage with a boosted voltage value, so that the first voltage with a higher voltage value or a longer time is applied to the unselected word line, thereby enabling the voltage on the unselected word line (i.e., on the far end B of the unselected word line) to rise quickly and avoiding the problem that the second voltage on the unselected word line cannot rise to a target pass voltage since a load is excessive when the second drive circuit 1302 is connected to the unselected word line as the pulse signal becomes a low level.

According to embodiments, the second drive circuit 1302 starts to apply the pass voltage to the unselected word line in response to that the first drive circuit 1301 stops applying the first voltage to the unselected word line.

According to some embodiments, the second drive circuit 1302 comprises an error amplifier 1306, an MOS transistor 1307, and resistors 1308-1310 connected with the error amplifier 1306.

A positive input terminal of the error amplifier 1306 may receive a reference voltage. As shown in FIG. 6, when the first switch cell 1305 is turned off, the error amplifier 1306 enters into a negative feedback process, such that the voltage output by the second drive circuit 1302 can be controlled based on a magnitude of the reference voltage at the positive input terminal of the error amplifier. When magnitudes of the reference voltage and resistors 1308-1310 are set reasonably, the second drive circuit 1302 may output and apply the pass voltage to the unselected word line 1311.

The detailed description as above further details the purposes, technical solutions and advantageous effects of the present disclosure. It is understood that, the above are merely detailed description of the present disclosure, and do not restrict the present disclosure. Any modification, equivalent replacement, improvement and the like, within the spirit and principles of the present disclosure, should be included in the protection scope of the present disclosure.

What is claimed is:

1. A method of operating a non-volatile memory, the non-volatile memory comprising a plurality of memory cells, and unselected word lines connected with the plurality of memory cells, the method comprising:
    applying a first voltage rising at a first slope to the unselected word lines to charge the unselected word lines and to allow a second voltage on the unselected word lines to rise at a second slope, the first slope being greater than the second slope; and
    stopping applying the first voltage to the unselected word lines in response to the first voltage rising at the first slope to reach a predetermined voltage, wherein the predetermined voltage is higher than a pass voltage of the plurality of memory cells connected with the unselected word lines.

2. The method of claim 1, wherein the second voltage is not higher than the pass voltage when the first voltage rises to the predetermined voltage.

3. The method of claim 2, wherein the second voltage is greater than 85% of the pass voltage when the first voltage rises to the predetermined voltage.

4. The method of claim 1, wherein
the non-volatile memory further comprises a comparator; and
applying the first voltage rising at the first slope to the unselected word lines comprises:
inputting a ramp voltage rising with time, and a boosted drive voltage to the comparator to allow the comparator to output a pulse signal; and
determining whether to apply the first voltage to the unselected word lines based on the pulse signal.

5. The method of claim 4, wherein
a level of the pulse signal is high when the ramp voltage is lower than the boosted drive voltage; and
the level of the pulse signal is low when the ramp voltage is higher than or equal to the boosted drive voltage.

6. The method of claim 5, wherein the boosted drive voltage is 7 V.

7. The method of claim 4, wherein
the ramp voltage is lower than the boosted drive voltage before the first voltage rises to the predetermined voltage; and
the ramp voltage is higher than the boosted drive voltage after the first voltage rises to the predetermined voltage.

8. The method of claim 4, wherein
the non-volatile memory further comprises a voltage source, and a first switch cell receiving the pulse signal from the comparator; and
determining whether to apply the first voltage to the unselected word lines based on the pulse signal comprises electrically connecting the voltage source with the unselected word lines through the first switch cell in response to the pulse signal inputted to the first switch cell being at a high level, to allow the voltage source to apply the first voltage to the unselected word lines.

9. The method of claim 8, wherein determining whether to apply the first voltage to the unselected word lines based on the pulse signal further comprises:
disconnecting the first switch cell in response to the pulse signal inputted to the first switch cell being at a low level, to enable the voltage source to stop applying the first voltage to the unselected word lines.

10. The method of claim 4, wherein
the non-volatile memory further comprises a drive circuit; and
the method further comprises applying the pass voltage to the unselected word lines through the drive circuit when stopping applying the first voltage to the unselected word lines.

11. The method of claim 10,
wherein the drive circuit comprises an error amplifier, and a plurality of resistors connected with the error amplifier; and
wherein applying the pass voltage to the unselected word lines through the drive circuit comprises:
inputting a reference voltage to a positive input terminal of the error amplifier; and
outputting the pass voltage based on the reference voltage and resistance values of the plurality of resistors, and applying the pass voltage to the unselected word lines.

12. The method of claim 4, wherein the pulse signal is maintained at a high level before the first voltage rises to the predetermined voltage.

13. The method of claim 10, wherein the pulse signal is maintained at a low level after the first voltage rises to the predetermined voltage.

14. The method of claim 1, further comprising:
outputting the pass voltage, lower than the predetermined voltage, to the unselected word lines after the first voltage reaches the predetermined voltage.

15. A non-volatile memory, comprising:
a plurality of memory cells;
unselected word lines connected with the plurality of memory cells;
a voltage generator configured to supply a first voltage to the unselected word lines; and
a controller coupled to the voltage generator and controlling the voltage generator to:
apply the first voltage rising at a first slope to the unselected word lines to charge the unselected word lines;
stop applying the first voltage to the unselected word lines in response to the first voltage rising to a predetermined voltage, wherein the predetermined voltage is higher than a pass voltage of the plurality of memory cells connected with the unselected word lines; and
allow a second voltage on the unselected word lines to rise at a second slope when applying the first voltage rising at the first slope to the unselected word lines, the first slope being greater than the second slope, and the second voltage being not higher than the pass voltage when the first voltage rises to the predetermined voltage.

16. The non-volatile memory of claim 15, wherein the second voltage is greater than 85% of the pass voltage when the first voltage rises to the predetermined voltage.

17. The non-volatile memory of claim 15, wherein
the voltage generator further comprises a comparator; and
the comparator is configured to:
receive a ramp voltage rising with time, and a boosted drive voltage through the comparator to allow the comparator to output a pulse signal; and
determine whether to apply the first voltage to the unselected word lines based on the pulse signal.

18. The non-volatile memory of claim 17, wherein
a level of the pulse signal is high when the ramp voltage is lower than the boosted drive voltage; and
the level of the pulse signal is low when the ramp voltage is higher than or equal to the boosted drive voltage.

19. The non-volatile memory of claim 18, wherein the boosted drive voltage is 7V.

20. The non-volatile memory of claim 17, wherein
the ramp voltage is lower than the boosted drive voltage before the first voltage rises to the predetermined voltage; and
the ramp voltage is higher than the boosted drive voltage after the first voltage rises to the predetermined voltage.

* * * * *